(12) United States Patent
Lu et al.

(10) Patent No.: US 8,771,498 B2
(45) Date of Patent: Jul. 8, 2014

(54) ELECTROCHEMICAL METHODS FOR MAKING SILICON NANOPOWDER, SILICON NANOWIRES AND SILICON NANOTUBES

(75) Inventors: Shigang Lu, Beijing (CN); Juanyu Yang, Beijing (CN); Xiangjun Zhang, Beijing (CN); Surong Kan, Beijing (CN)

(73) Assignee: General Research Institute for Nonferrous Metals, Beijing (CN)

( * ) Notice: Subject to any disclaimer, the term of this patent is extended or adjusted under 35 U.S.C. 154(b) by 0 days.

(21) Appl. No.: 13/098,988

(22) Filed: May 2, 2011

(65) Prior Publication Data

US 2011/0203938 A1    Aug. 25, 2011

Related U.S. Application Data

(63) Continuation of application No. PCT/CN2009/074801, filed on Nov. 5, 2009.

(30) Foreign Application Priority Data

Nov. 6, 2008    (CN) .......................... 2008 1 0225926

(51) Int. Cl.
*C25B 1/00*    (2006.01)
(52) U.S. Cl.
CPC .............. *C25B 1/006* (2013.01); *Y10S 977/762* (2013.01); *Y10S 977/814* (2013.01); *Y10S 977/899* (2013.01)
USPC ........... 205/410; 977/762; 977/814; 977/899; 977/762
(58) Field of Classification Search
CPC ....................................... C25B 1/006
USPC ....................................... 205/410
See application file for complete search history.

(56) References Cited

U.S. PATENT DOCUMENTS

2004/0052672 A1*    3/2004    Fray et al. ................. 419/30

FOREIGN PATENT DOCUMENTS

| JP | 2006-321688 | 11/2006 |
|---|---|---|
| WO | 99/64638 | 12/1999 |
| WO | 02/40725 A2 | 5/2002 |

OTHER PUBLICATIONS

Bardakhanov et al, Nanopowder obtained by evaporating initial substances in an electron accelerator at atmospheric pressure, Doklady Physics, vol. 51, No. 7, 2006, pp. 353-356.*
Yang et al, Electrochemical preparation of silicon nanowires from nanometre silica in molten calcium chloride, Chemical Communications, Apr. 22, 2009, pp. 3273-3275.*
Jin et al, Electrochemical preparation of silicon and its alloys from solid oxides in molten calcium chloride, Angewandte Chemie, vol. 116, 2004, pp. 751-754.*
Sharma, Synthesis of Inorganic Nanowires and Nanotubes, Encyclopedia of Nanoscience and Nanotechnology, vol. 10, 2004, pp. 327-346.*
Terekhov et al, Structure and optical properties of silicon nanopowders, Materials Science & Engineering B, vol. 147, 2008, pp. 222-225.*
Jin et al, Electrochemical Preparation of Silicon and Its Alloys from Solid Oxides in Molten Calcium Chloride, Angewandte Chemie International Edition, vol. 43, 2004, pp. 733-736.*
Kucera et al, Solubility of Magnesium Oxide in Calcium Oxide—Calcium Chloride Mixtures, Metallurgical Transactions B, vol. 7B, Jun. 1976, pp. 213-215.*
Pistorius et al, Formation of Silicon by electro-deoxidation, and implications for titanium metal production, The Journal of the South African Institute of Mining and Metallurgy, vol. 106, Jan. 2006, pp. 31-41.*
Nohira et al, Pinpoint and bulk electrochemical reduction of insulating silicon dioxide to silicon, Nature Materials, vol. 2, Jun. 2003, pp. 397-401.*

* cited by examiner

*Primary Examiner* — Harry D Wilkins, III
(74) *Attorney, Agent, or Firm* — Staas & Halsey LLP

(57) ABSTRACT

An electrochemical method for producing Si nanopowder, Si nanowires and/or Si nanotubes directly from compound SiX or a mixture containing a silicon compound SiX, the method comprises: providing an electrolysis cell having a cathode, an anode and an electrolyte, using the compound SiX or the mixture containing compound SiX as a cathode and immersing the cathode in an electrolyte comprising a metal compound molten salt, applying a potential between the cathode and the anode in the electrolysis cell, and forming one or more of Si nanopowder, Si nanowires and Si nanotubes on the cathode electrode. The method has advantages of: 1) shorter production processing, 2) inexpensive equipment, 3) convenient operation, 4) reduction of contaminate, 5) easily available feed materials, and 6) easy to achieve continuous production. This is a new field of using electrochemical method for producing one-dimensional Si nano material, and a new method of producing Si nanopowder, Si nanowires and Si nanotubes.

13 Claims, 6 Drawing Sheets

ELECTROCHEMICAL METHODS FOR MAKING SILICON NANOPOWDER, SILICON NANOWIRES AND SILICON NANOTUBES

CROSS REFERENCE TO RELATED APPLICATION

This application is a continuation application filed under 35 U.S.C. §111(a), claiming the benefit under 35 U.S.C. §120 and §365(c) of a PCT International Application Number PCT/CN2009/074801, filed Nov. 5, 2009, it being further noted that foreign priority benefit is based upon Chinese Patent Application 200810225926.5, filed Nov. 6, 2008 in the State Intellectual Property Office of P.R. China, the disclosures of which are thereby incorporated by reference.

TECHNICAL FIELD

The present invention relates to an electrochemical method for fabricating silicon nanopowder, silicon nanowires and silicon nanotubes.

BACKGROUND

The unique electrical and optical properties and high surface activity feature of one-dimensional nanowires (tubes) materials have attracted great interest in recent years. There are many ways to fabricate Si nanowires (tubes) at present, including a laser ablation (Morales A M, Lieber C M. Science, 1998, 279(9):208~211; Lee C S, Wang N, Tang Y H, et al. MRS. Bulletin., 1999:36~41), a chemical vapor deposition (CVD) (Wang N L, Zhang Y J, Zhu J. Journal of Materials Science Letters, 2001, 20:89~91), a plasma enhanced chemical vapor deposition (PECVD) (Zeng X B, Xu Y Y, Zhang S B, et al. Journal of Crystal Growth, 2003, 247 (1):13~16), a thermal vapor deposition (Feng S Q, Yu D P, Zhang H Z, et al. Journal of Crystal Growth, 2000, 209:513~517), a solution technique (Holmes J D, Johnston K P, Doty R C, et al. Science, 2000, 287:1471~1473), a selective plating (Lew K K, Redwing J M. Journal of Crystal Growth, 2003, 254(1):14~22) and a hydrothermal deposition (Pei L Z, Tang Y H, Chen Y W, et al. Journal of Crystal Growth, 2005, 289:423~427). Nanowires produced by a laser ablation method have high yield and high purity. But its shortcoming is high costs for expensive equipments. On the contrary, chemical vapor deposition (CVD) and thermal chemical vapor deposition techniques are relatively low costs, but the products' diameters vary over a wide range. The products also contain plentiful nano-chains. Solution-grown technique can produce nanowires with high length-diameter ratio, but requires using noble metals as catalyst. In addition, the organic and toxic solution has to be recycled, since it will pollute the environment. Other techniques, such as selective plating etc., the yields of nanowires are quite low. The shortcomings of all the above-mentioned techniques hamper the industrial use of nanowires.

In molten salt studies, the electrochemical method of fabricating metal, alloy and non-metal directly from solid compounds by electrolysis has been provided by Fray Derek John, Farthing Thomas William and Chen Zheng of Cambridge GB, therefore this method is also called FFC Cambridge techniques. The FFC Cambridge method has advantages over other methods. It uses solid compounds to fabricate metal, alloy and non-metal by a one-step electrolysis, thereby it shortens the production process, saves energy and reduces pollution and costs. Since the composition and the reduction level of the materials can be controlled, this method is used in functional materials production. Both international publications "Removal of oxygen from metal oxides and solid solutions by Electrolysis in a fused salt" (WO1999/064638) and "Metal and alloy powders and powder fabrication" (WO2002/040725) by this Cambridge team claimed the technique for fabricating silicon powder directly from solid $SiO_2$ powder. Japanese patent (JP2006/321688) also discloses a method for producing silicon powder by using silicon dioxide powder mixed with silicon or single crystal silicon wafer as conductor, and electrolyzing high-purity quartz. Micron silicon powder is produced by using the methods disclosed by above three patents. However, electrochemical methods for fabricating silicon nanopowder, silicon nanowires (tubes) from silicon compound SiX or silicon mixture comprising silicon compound SiX have not been published.

SUMMARY

One aspect of an embodiment of the present invention provides an electrochemical method for producing one or more of silicon nanopowder, silicon nanowires and nanotubes directly from silicon compound SiX powder or a powdered mixture containing silicon compound SiX and other species. The method has many advantages: 1) shorter production processing, 2) inexpensive equipment, 3) convenient operation, 4) reduction of contaminate, 5) easily available feed materials, and 6) easy to achieve continuous production.

Another aspect of an embodiment of the present invention describes the electrochemical method for making Si nanopowder, Si nanowires or Si nanotubes directly from silicon compound SiX powder. The electrochemical method uses an electrolysis cell which comprises a silicon compound SiX as a cathode, an anode, and a molten salt electrolyte which may contain metal compound. Electrolysis occurs when a potential is applied between the cathode and the anode. Products including Si nanopowder, Si nanowires and/or Si nanotubes can be obtained on the cathode. In the formula SiX, X can be O, S, C or N.

By using a method of the present invention, the following types of nano materials can be produced: (1) silicon nanowires and silicon nanotubes, (2) only silicon nanowires, (3) silicon nanopowder, silicon nanowires and silicon nanotubes, or (4) only silicon nanopowder on the cathode.

According to the present invention, the electrochemical method for producing nanopowder, nanowires and/or nanotubes containing silicon directly from a powder mixture containing silicon compound SiX. This method may comprise a silicon compound SiX cathode, an anode and a molten salt electrolyte containing metal compound. Electrolysis occurs when a potential is applied between the anode and the cathode. The obtained electrolysis products on the cathode include at least one of Si nanopowder, Si nanowires and Si nanotubes, wherein X in the formula SiX can be O, S, C or N.

By using a method of this invention, the electrolysis products on the cathode include 1) silicon nanowires and silicon nanotubes; 2) only silicon nanowires; 3) silicon nanopowder, silicon nanowires and silicon nanotubes; or 4) only silicon nanopowder.

According to the method of the invention, the average diameter of the silicon compound SiX powder may be less than 1 μm.

According to the method of the invention, the mixture containing silicon compound SiX may be a mixture prepared by adding a metal, an alloy, a metal compound $M^1Y$ and/or a nonmetal into the silicon compound SiX powder, wherein the metal, the alloy, the metal compound $M^1Y$ and the nonmetal are in powder forms.

According to the method of the invention, the metal may be Au, Pt, Ag, Cu, Fe, Co, Ni, Cr, Mo, Zr. Ti, Al, Mg and/or Nb.

According to the method of the invention, the mentioned alloy may comprise at least two metals selected from the group of Au, Pt, Ag, Cu, Fe, Co, Ni, Cr, Mo, Zr. Ti, Al, Mg and Nb.

According to the method of the invention, $M^1$ in the metal compound $M^1Y$ may be Au, Pt, Ag, Cu, Fe, Co, Ni, Cr, Mo, Zr, Ti, Al, Mg or Nb; and Y may be O, S, C or N.

According to the method of the invention, the non-metal may be C, Si, Ge, S, P and/or B.

According to the method of the invention, the metal compound of the metal compound of the molten salt may be represented by formula $MY^1$, wherein M is Ca, Ba, Li, Al, Cs, Na, K or Sr; and $Y^1$ is Cl or F.

According to the method of the invention, the molten salt electrolyte containing metal compound may contain one or more electrolyte salt According to the method of the invention, the electrolyte may comprise CaO, which is produced by hydrolyzing fused $CaCl_2$ at high temperature.

According to the method of the invention, the potential applied between the cathode and the anode is preferably less than 3.2 v.

According to the method of the invention, the potential applied between the cathode and the anode is preferably less than the decomposition potential of electrolyte.

According to the method of the invention, the temperature range for the electrolysis is preferably between 500° C. and 1000° C.

According to the method of the invention, the average diameter of the silicon nanopowder is preferably less than 100 nm.

According to the method of the invention, the diameter of the silicon nanowires is preferably less than 100 nm.

According to the method of the invention, the diameter of the silicon nanotubes is preferably less than 100 nm.

According to the method of the invention, the electrolysis products comprise Si nanopowder having a diameter less than 100 nm, Si nanowires having a diameter less than 100 nm and/or Si nanotubes having a diameter less than 100 nm.

According to the method of the invention, the electrolytic products comprise one or more species selected from the group of Si nanopowder, nanowires and nanotubes.

The main characteristics of this invention are:

(1) The feed materials has rich resources; no pollution during preparation and production.

(2) Since the silicon nanopowder, nanowires and/or nanotubes are prepared in electrolyte, there is no problem of tangled and intertwist.

(3) The shape of products of silicon nanopowder, nanowires and/or nanotubes can be controlled and the difference in size of electrolytic products is in a narrow range.

(4) The production and equipments are easy to install and operate.

(5) Since the feed materials and the products are all in solid state, it is easy to achieve continuous production.

DETAILED DESCRIPTION OF THE INVENTION

Figure 1:
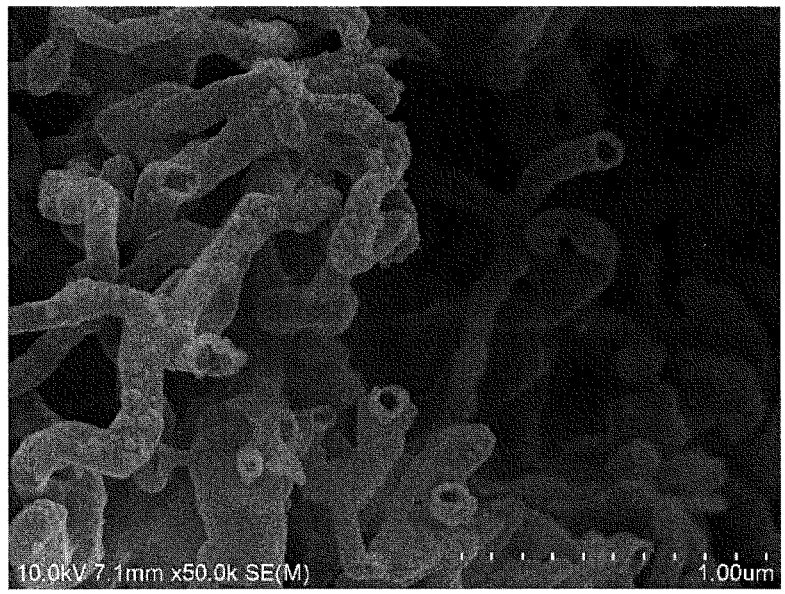
FIG. 1 shows a scanning electron microscope (SEM) image of silicon nanowires and nanotubes of the present invention produced from silicon dioxide at 800° C.

The invention will be described in detail as below.

The electrochemical method for producing silicon nanopowder, silicon nanowires and/or silicon nanotubes directly from silicon compound SiX or a mixture containing silicon compound SiX, the method comprises:

1. Providing a silicon compound SiX or a mixture containing silicon compound SiX as cathode, contacting the cathode with a molten salt electrolyte containing $MY^1$ metal compound; providing an anode and contacting it with the electrolyte; applying a potential between the cathode and the anode and controlling the reaction conditions.

The formation of the cathode is to mix silicon compound SiX powder with a binder, or to mix a powder mixture containing silicon compound SiX with either distilled water or anhydrous ethanol, the amount of water or ethanol are 40%-60% of the powder mixture in weight, and then press the mixture into pellet.

2. According to method 1, X in the chemical formula of SiX is any one of O, S, C or N.

3. According to method 1, the mixture comprising silicon compound SiX may be a silicon compound SiX powder mixed with the metal(s) selected from the group of Au, pt, Ag, Cu, Fe, Co, Ni, Cr, Mo, Zr, Ti, Al, Mg and Nb, or an alloy comprising at least two of said metals.

4. According to method 1, the mixture of silicon compound SiX may be a silicon compound SiX mixed with non-metal selected from the group of C, Si, Ge, S, P and B.

5. According to method 1, the mixture of silicon compound SiX may be a silicon compound SiX mixed with metal compound $M^1Y$, wherein $M^1$ is Au, pt, Ag, Cu, Fe, Co, Ni, Cr, Mo, Zr, Ti, Al, Mg or Nb; Y is O, S, C or N.

The mixture of silicon compound SiX may be a silicon compound SiX mixed with at least one selected from the group of metal, alloy, metal compound $M^1Y$ and non-metal.

The weight of metal, alloy, metal compound $M^1Y$ and/or non-metal is 30 wt % of total weight of the mixture.

6. According to method 1, M may be Ca, Ba, Li, Al. Cs, Na, K or Sr; and $Y^1$ is Cl or F.

7. According to methods 1 and 5, the molten salt electrolyte comprising metal compound $MY^1$ may be one or more electrolyte salts.

8. According to method 1, the electrolyte may comprise CaO.

9. According to method 1, the potential applied between the cathode and the anode may be less than 3.2 v.

10. According to method 1, the potential applied between the cathode and the anode may be less than the decomposition potential of electrolyte.

11. According to method 1, the temperature range for electrolysis can be between 500 ° C. and 1000° C.

12. According to method 1, the products may be taken out from the molten salt with the working electrode. And if necessary, a new solid electrode containing silicon compound SiX or a mixture comprising silicon compound SiX may be set into the electrolyte to carry out a new round of electrolysis, thereby a continuous production of silicon nanopowder, silicon nanowires and/or silicon nanotubes is achieved.

13. According to method 1, after taking out the electrolytic product from the molten salt, the product is cooled down to room temperature in inert gas, then washed thoroughly in dilute inorganic acid, distilled water and organic solution, dried in vacuum. The dilute inorganic acid may be hydrochloric acid of 1-3 vol % concentration.

14. According to method 1, the average diameter of the produced silicon nanopowder, silicon nanowires and silicon nanotubes is less than 100 nm.

15. According to method 1, the electrolytic product comprising at least one of silicon nanopowder, silicon nanowires and/or silicon nanotubes.

Figure 2:
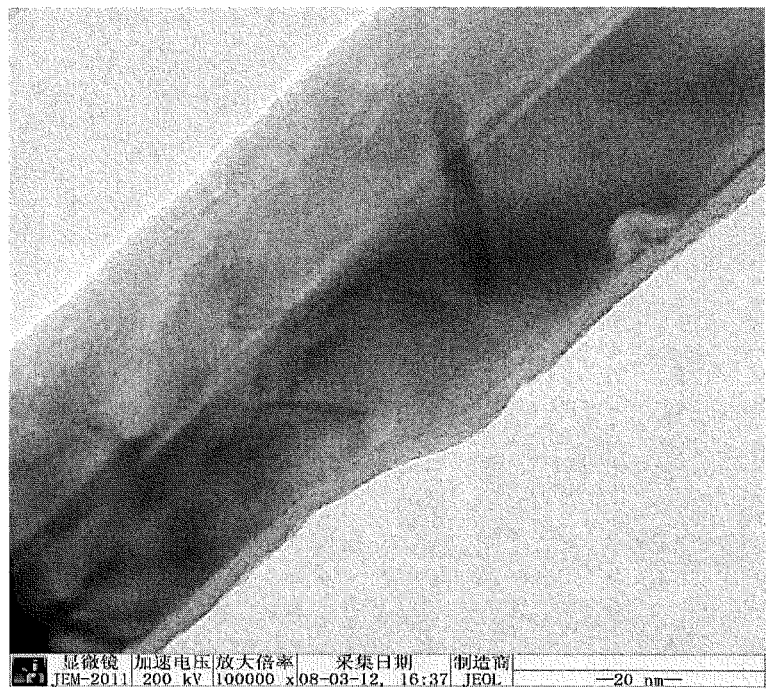
FIG. 2 shows a transmission electron microscopy (TEM) image of a single silicon nanowire of the present invention produced from silicon dioxide at 800° C.
Figure 3:
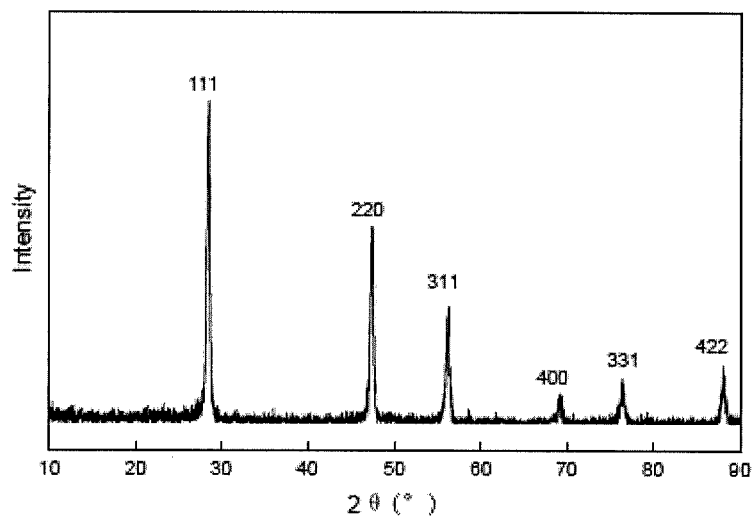
FIG. 3 shows an x-ray diffraction pattern of silicon nanowires (tubes) of the present invention produced from silicon dioxide at 800° C.
Figure 4:
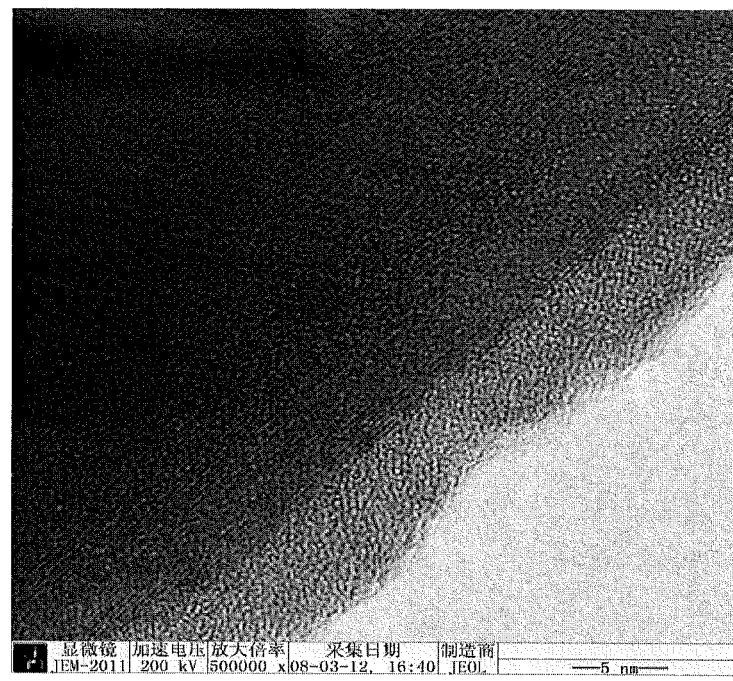
FIG. 4 shows a high-resolution transmission electron microscopy (TEM) image of silicon nanowires of the present invention produced from silicon dioxide at 800° C.
Figure 5:
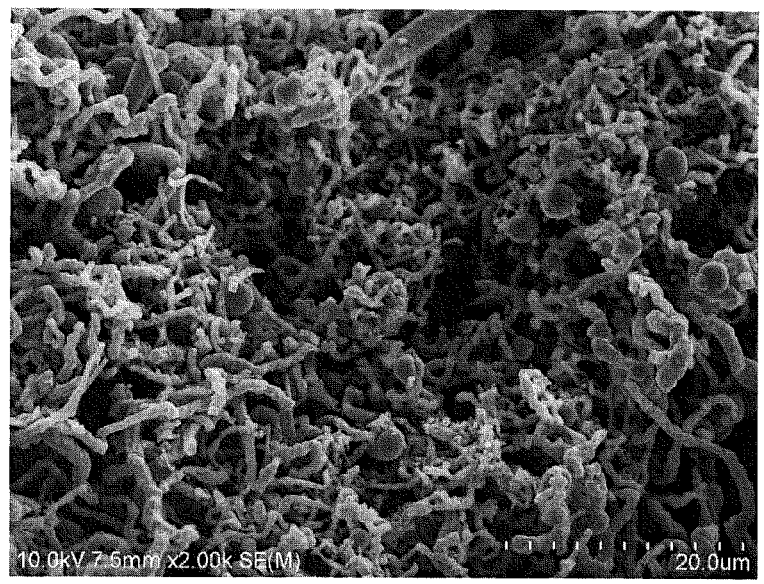
FIG. 5 shows a scanning electron microscope (SEM) image of silicon nanowires (tubes) of the present invention produced from silicon dioxide at 1000° C.
Figure 6:
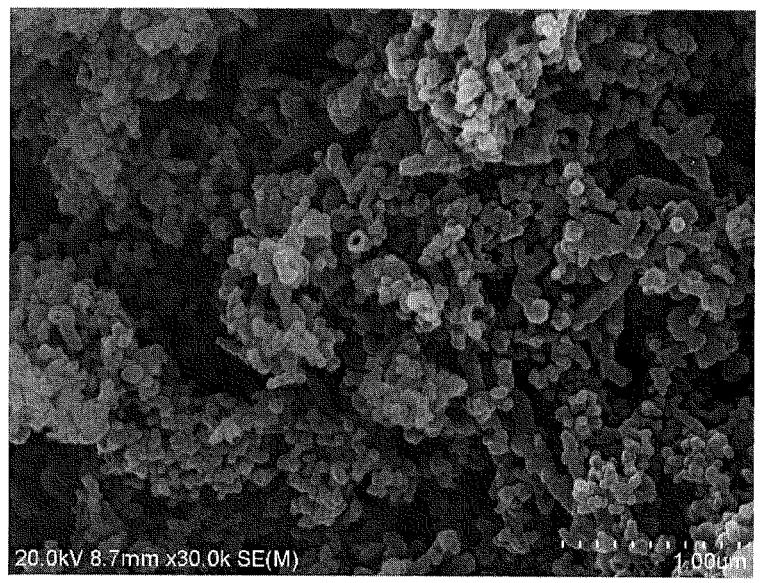
FIG. 6 shows a scanning electron microscope (SEM) image of silicon nano-grains of the present invention produced from silicon dioxide at 600° C.

FIG. 1 and FIG. 2 are scanning electron microscopy and transmission electron microscopy of a typical electrolysis products prepared from pure nanometer silicon dioxide respectively. Both figures show that the silicon nanowires' and nanotubes' diameters are between 50-100 nm and lengths are 2-5 µm. Shown in FIG. 3 is the X-ray diffraction pattern of a silicon crystal product. Shown in FIG. 4 is high-resolution transmission electron microscopy image of electrolytic product, it indicates that the surface of the silicon nanowires has amorphous silicon dioxide layer. The d spacing of silicon crystal is about 0.31 nm (by measure and calculation), this indicates that the silicon plane is (111). Silicon nanowires and nanotubes produced from pure silicon dioxide at different temperatures are shown in FIG. 5, and Silicon nanograin produced from the same at different temperatures are shown in FIG. 6.

EXAMPLES

Following examples are used to describe this invention. The "nano-$SiO_2$ powder" in the starting material of the following examples is a powder having diameters less than 100 nm. Examples 1-3 relate to produce pure silicon nanowires and nanotubes by electrolytic reduction of $SiO_2$.

Example 1

A $SiO_2$ powder having a purity of 99.95 wt % and an average diameter of 0.2 µm is mixed with a binder. The amount of the $SiO_2$ powder in the total mixture is 75 wt % and that of the binder is 25 wt %. The mixture is pressed into a porous pellet with 10 mm in diameter, 1.1 mm in thickness by 5 MPa mechanical stress, and then it is sintered at 1100° C. in air for about 5 hours. After that, the sintered $SiO_2$ pellets are combined with a current collector to form a cathode. A graphite rod is used as an anode and molten $CaCl_2$ is used as an electrolyte. Electrolysis is carried out at 800° C., 3.0 v in argon atmosphere. After electrolysis for 2 hours, the electrolytic products are washed by 1 vol % dilute hydrochloric acid, distilled water and anhydrous ethanol. Then the product is dried in a vacuum. The final products shown in FIG. 1 are curved silicon nanowires having a diameter of about 50 nm and a length of 2-5 µm.

Example 2

A $SiO_2$ powder having a purity of 99.95 wt % and an average diameter of 0.25 µm is mixed with a binder. The amount of the $SiO_2$ powder in the total mixture is 75 wt % and that of the binder is 25 wt %. The mixture is pressed into a porous pellet with 10 mm in diameter, 1.2 mm in thickness by 10 MPa mechanical stress, and then it is sintered at 1200° C. in air for about 4 hours. After that, the sintered $SiO_2$ pellets are combined with a current collector to form a cathode. A graphite rod is used as an anode and molten $CaCl_2$ is used as an electrolyte. Electrolysis is carried out at 1000° C., 2.0 v in helium atmosphere. After electrolysis for 4 hours, the electrolytic products are washed by 1 vol % dilute hydrochloric acid, distilled water and anhydrous ethanol. Then the product is dried in a vacuum. The final products shown in FIG. 5 are curved silicon nanowires and nanotubes having a diameters of between 50-100 nm and a lengths of 2-5 m, FIG. 5 also show some small amount of micrometre spheres.

Example 3

A $SiO_2$ powder having a purity of 99.95 wt % is mixed with a binder. The amount of the $SiO_2$ powder in the total mixture is 75 wt % and that of the binder is 25 wt %. The mixture is pressed into a porous pellet with 10 mm in diameter, 1.5 mm in thickness by 15 MPa mechanical stress, and then it is sintered at 100° C. in air for about 1.5 hours, and then at 1100° C. in air for 3 hours. After that, the sintered $SiO_2$ pellets are combined with a current collector to form a cathode. A graphite rod is used as an anode and molten $CaCl_2$+NaCl are used as an electrolyte, wherein the ratio of $CaCl_2$ and NaCl is 51/49 in weight. Electrolysis is carried out at 600° C., 2.5 v in helium atmosphere. After electrolysis for 5 hours, the electrolytic products are washed by 1 vol % dilute hydrochloric acid, distilled water and anhydrous ethanol in turns. Then the product is dried in a vacuum. The final products shown in FIG. 6 are mostly silicon nano spheres having a diameter of 30-50 nm. A small amount of silicon nanowires and nanotubes can be seen under high-resolution electron microscopy.

FIG. 7 to FIG. 12 show silicon nanograin, nanowires and/or nanotubes produced with silicon compound SiX mixture as starting material. Examples 4-10 relate to producing silicon nanopowder, nanowires and/or nanotubes by electrolytic reduction method from silicon dioxide comprising conductive material.

Example 4

A $SiO_2$ powder having a purity of 99.95 wt % is mixed with an A.R. Ag powder having a grain size of 300 M. The amount of the $SiO_2$ powder in the total mixture is 75 wt % and that of Ag powder is 25 wt %. Then distilled water that 50 wt % of the total mixture is added. The mixture is pressed into a porous pellet with 10 mm in diameter, 1.5 mm in thickness by 15

Figure 7:
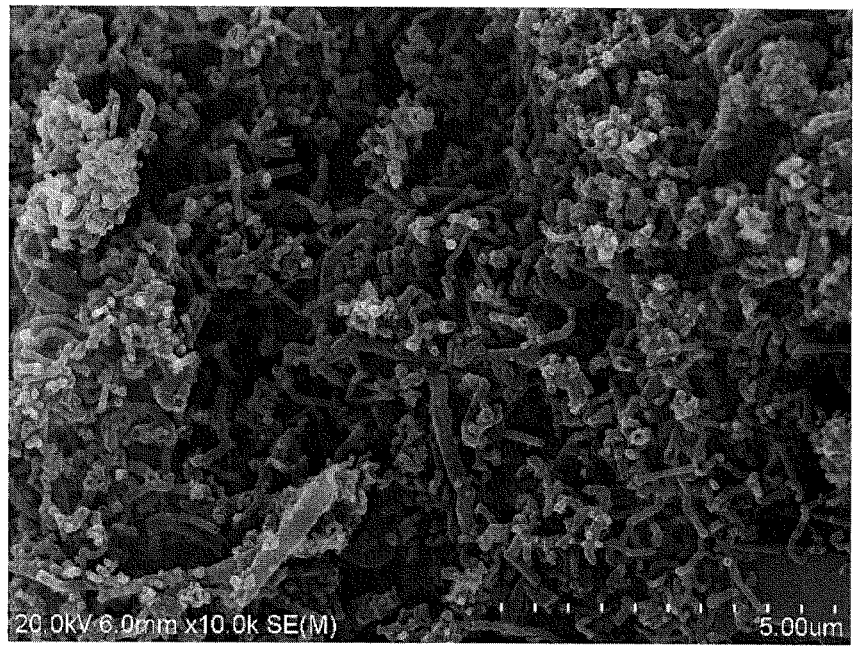
FIG. 7 shows a scanning electron microscope (SEM) image of silicon nanowires/tubes/grains of the present invention produced from silver powder and silicon dioxide at 800° C.

MPa mechanical stress, and then is sintered at 100° C. in air for about 1.5 hours, and then at 800° C. in air for 3 hours. After that, the sintered $SiO_2$ pellets are combined with a current collector to form a cathode. A graphite rod is used as an anode and molten $CaCl_2$+NaCl is used as an electrolyte, wherein the ratio of $CaCl_2$ and NaCl is 51/49 in weight. Electrolysis is carried out at 800° C., 2.5 v in argon atmosphere. After electrolysis for 5 hours, the electrolytic products are washed by 1 vol % dilute hydrochloric acid, distilled water and anhydrous ethanol. Then the product is dried in a vacuum. The final products shown in FIG. 7 are silicon nanowires and nanotubes having diameters of about 30 nm and lengths of about 1 μm. The nanowires and nanotubes are curved and have smooth surface.

Example 5

Figure 8:
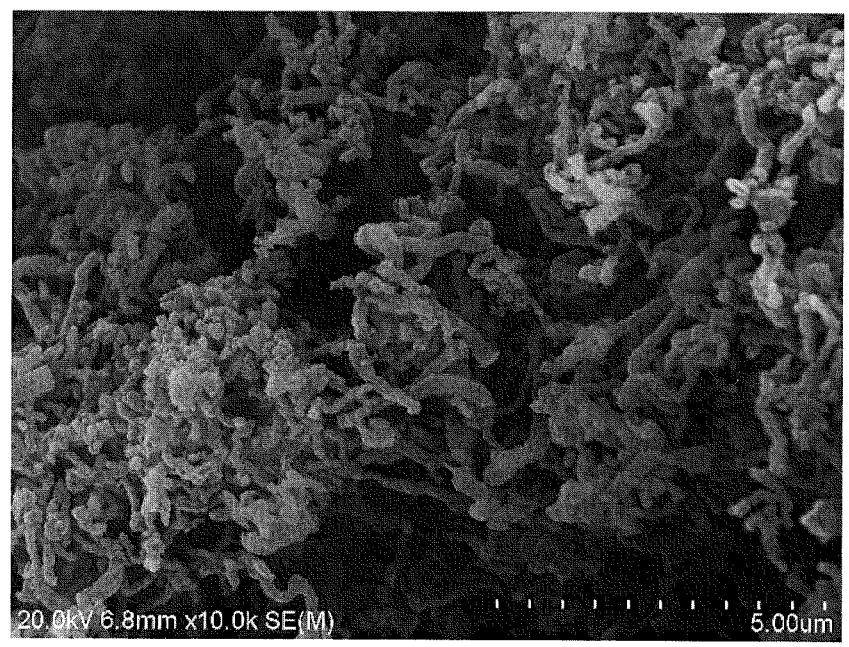
FIG. 8 shows a scanning electron microscope (SEM) image of silicon nanowires (tubes) of the present invention produced from cobalt powder and silicon dioxide at 800° C.

A $SiO_2$ powder having a purity of 99.95 wt % is mixed with an A.R. Co powder having a grain size of 200 nm. The amount of the $SiO_2$ powder in the total mixture is 80 wt % and that of Co powder is 20 wt %. Then distilled water that 50 wt % of the total mixture is added. The mixture is pressed into a porous pellet with 10 mm in diameter, 1.5 mm in thickness by 4 MPa mechanical stress, and then it is sintered at 150° C. in air for about 1.5 hours, and then at 1000° C. in air for 3 hours. After that, the sintered $SiO_2$ pellets are combined with a current collector to form a cathode. A graphite rod is used as an anode and molten $CaCl_2$+NaCl is used as an electrolyte, wherein the ratio of $CaCl_2$ and NaCl is 51/49 in weight. Electrolysis is carried out at 800° C., 2.2 v in argon atmosphere. After electrolysis for 4 hours, the electrolytic products are washed by 1 vol % dilute hydrochloric acid, distilled water and anhydrous ethanol. Then the product is dried in a vacuum. The final products shown in FIG. 8 are silicon nanowires and nanotubes having a diameter of about 100 nm and lengths of about 1 μm. The silicon nanowires and nanotubes have rough surface attached with some nano-grains of about 10 nm.

Example 6

Figure 9:
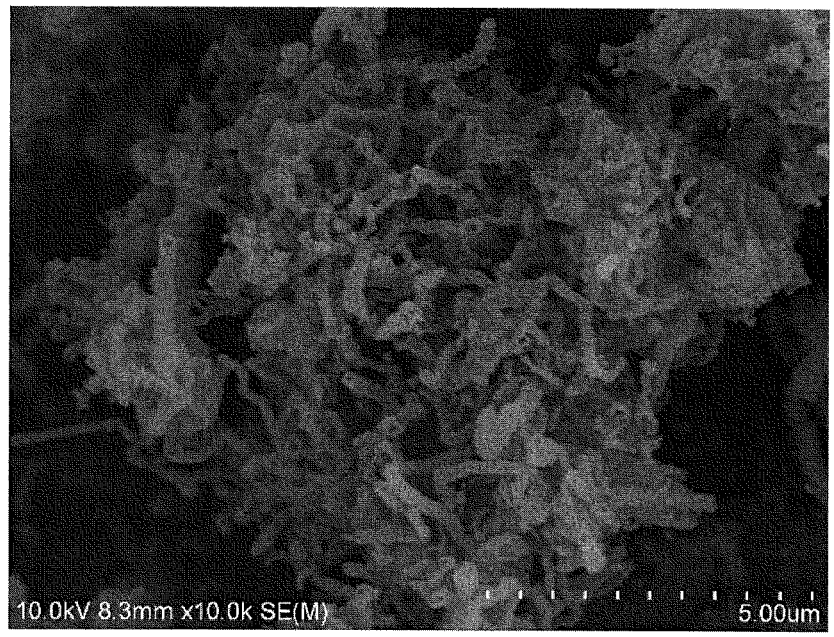
FIG. 9 shows a scanning electron microscope (SEM) image of silicon nanowires (tubes) of the present invention produced from nickel powder and silicon dioxide at 800° C.

A $SiO_2$ powder having a purity of 99.95 wt % is mixed with a Ni fiber having a diameter of 2-3 μm. The amount of the $SiO_2$ powder in the total mixture is 80 wt % and that of Ni fiber is 20 wt %. Then anhydrous ethanol that 50 wt % of the total mixture is added. The mixture is pressed into a porous pellet with 10 mm in diameter, 1.5 mm in thickness by 15 MPa mechanical stress, and then it is sintered at 100° C. in air for about 1.5 hours, and then at 1000° C. in air for 3 hours. After that, the sintered $SiO_2$ pellets are combined with a current collector to form a cathode. A graphite rod is used as an anode and molten $CaCl_2$+NaCl is used as electrolyte, wherein the ratio of $CaCl_2$ and NaCl is 51/49 in weight. Electrolysis is carried out at 800° C., 2.0 v in argon atmosphere. After electrolysis for 5 hours, the electrolytic products are washed by 1 vol % dilute hydrochloric acid, distilled water and anhydrous ethanol. Then the product is dried in a vacuum. The final products shown in FIG. 9 are silicon nanowires and nanotubes having a diameter of about 100 nm and a length of about 6 μm. The silicon nanowires and nanotubes have rough surface attached with some nanograin of about 10 nm.

Example 7

Figure 10:
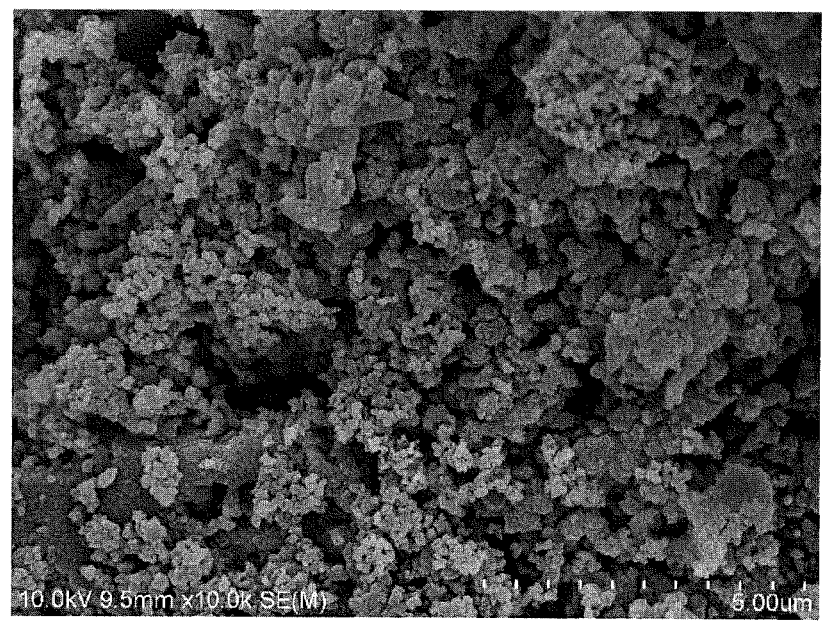
FIG. 10 shows an electron microscope (SEM) image of silicon nanowires and silicon nano-grains of the present invention produced from silicon powder and silicon dioxide at 900° C.

A $SiO_2$ powder having a purity of 99.95 wt % is mixed with a Si powder having a grain size of 300 nm. The amount of the $SiO_2$ powder in the total mixture is 80 wt % and that of Si powder is 20 wt %. Then anhydrous ethanol that 50 wt % of the total mixture is added. The mixture is pressed into a porous pellet with 10 mm in diameter, 1.5 mm in thickness by 15 MPa mechanical stress, and then is sintered at 100° C. in air for about 1.5 hours, and then at 1000° C. in air for 3 hours. After that, the sintered $SiO_2$ pellets are combined with a current collector to form a cathode. A graphite rod is used as an anode and molten $CaCl_2$+NaCl is used as an electrolyte, wherein the ratio of $CaCl_2$ and NaCl is 51/49 in weight. Electrolysis is carried out at 900° C., 2.0 v in argon atmosphere. After electrolysis for 5 hours, the electrolytic products are washed by 1 vol % dilute hydrochloric acid, distilled water and anhydrous ethanol in turns. Then the product is dried in a vacuum. The final products shown in FIG. 10 are mostly silicon spheres having a diameters of 50-80 nm.

Example 8

Figure 11:
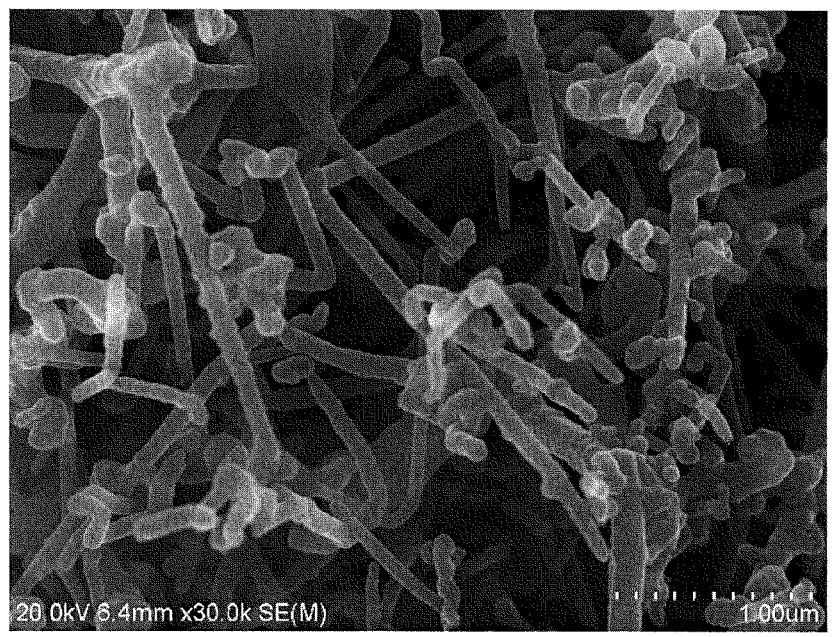
FIG. 11 shows a scanning electron microscope (SEM) image of silicon nanowires of the present invention produced from copper powder and silicon dioxide at 800° C.

A $SiO_2$ powder having a purity of 99.95 wt % is mixed with a A.R. Cu power having a grain size of 300 M. The amount of the $SiO_2$ powder in the total mixture is 80 wt % and that of Cu powder is 20 wt %. Then distilled water that 50 wt % of the total mixture is added. The mixture is pressed into a porous pellet with 10 mm in diameter, 1.5 mm in thickness by 6 MPa mechanical stress, and then it is sintered at 150° C. in air for about 1.5 hours, and then at 900° C. in air for 3 hours. After that, the sintered $SiO_2$ pellets are mass flow combined with a conductive electrode to form a cathode. A graphite rod is used as an anode and molten $CaCl_2$+NaCl is used as an electrolyte, wherein the ratio of $CaCl_2$ and NaCl is 51/49 in weight. Electrolysis is carried out at 800° C., 2.0 v in argon atmosphere. After electrolysis for 5 hours, the electrolytic products are washed by 1 vol % dilute hydrochloric acid, distilled water and anhydrous ethanol in turns. Then the product is dried in a vacuum. The final products shown in FIG. 11 are straight silicon nanowires having a diameter of 50-100 nm and a length of about 5 μm.

Example 9

A $SiO_2$ powder having a purity of 99.95 wt % is mixed with an A.R. graphite having a grain size of 5 μm. The amount of the $SiO_2$ powder in the total mixture is 80 wt % and that of the graphite is 20 wt %. Then distilled water that 50 wt % of the total mixture is added. The mixture is pressed into a porous pellet with 10 mm in diameter, 1.5 mm in thickness by 6 MPa mechanical stress, and then it is sintered at 150° C. in air for about 1.5 hours, and then at 900° C. in air for 3 hours. After that, the sintered $SiO_2$ pellets are mass flow combined with a conductive electrode to form a cathode. A graphite rod is used as an anode and molten $CaCl_2$+NaCl is used as an electrolyte, wherein the ratio of $CaCl_2$ and NaCl is 51/49 in weight. Electrolysis is carried out at 800° C., 2.5 v in argon atmosphere. After electrolysis for 5 hours, the electrolytic products are washed by 1 vol % dilute hydrochloric acid, distilled water and anhydrous ethanol. Then the product is dried in a vacuum. The final products are silicon nanowires having a diameter of about 150 nm and a length of about 4 μm.

Example 10

A $SiO_2$ powder having a purity of 99.95 wt % is mixed with a CuO having a grain size of 100 nm. The amount of the $SiO_2$ powder in the total mixture is 80 wt % and that of CuO is 20 wt %. Then distilled water that 50 wt % of the total mixture is added. The mixture is pressed into a porous pellet with 10 mm in diameter, 1.5 mm in thickness by 6 MPa mechanical stress, and then it is sintered at 150° C. in air for about 1.5 hours, and then at 900° C. in air for 3 hours. After that, the sintered $SiO_2$ pellets are mass flow combined with a conductive electrode to form a cathode. A graphite rod is used as an anode and molten $CaCl_2$+NaCl is used as an electrolyte, wherein the ratio of $CaCl_2$ and NaCl is 51/49 in weight. Electrolysis is carried out at 800° C., 2.5 v in argon atmosphere. After electrolysis for 5 hours, the electrolytic products are washed by 1 vol % dilute hydrochloric acid, distilled water and anhydrous ethanol. Then the product is dried in a vacuum. The final products are silicon nanowires having a diameter of about 70 nm and a length of about 6 μm.

The invention claimed is:

1. An electrochemical method for producing Si nanowires and/or Si nanotubes directly from a silicon compound $SiO_2$ powder, the method comprising:
    providing an electrolysis cell having a cathode, an anode and an electrolyte comprising a metal compound molten salt to carry out an electrolysis;
    using the silicon compound $SiO_2$ powder as the cathode and immersing the cathode in the electrolyte;
    applying a cell voltage between the cathode and the anode in the electrolysis cell; and
    forming, on the cathode, an electrolysis product comprising one or more of Si nanowires and Si nanotubes, wherein
    the cell voltage applied between the cathode and the anode is less than 3.2V, and
    the cell voltage applied between the cathode and the anode is less than a decomposition potential of the electrolyte, and
    the electrolyte comprises CaO formed by hydrolysis of molten salt $CaCl_2$ during a melting process at a high temperature.

2. The method of claim 1, wherein the Si nanowires has a diameter that is less than 100 nm.

3. The method of claim 1, wherein the Si nanotubes has a diameter that is less than 100 nm.

4. An electrochemical method for producing nanowires and/or nanotubes containing Si directly from a powdered mixture containing a silicon compound $SiO_2$ and other species, the method comprising:
    providing an electrolysis cell having a cathode, an anode and an electrolyte comprising a metal compound molten salt to carry out an electrolysis;
    using the powdered mixture containing the silicon compound $SiO_2$ as a cathode and immersing the cathode in the electrolyte;
    applying a cell voltage between the cathode and the anode in the electrolysis cell; and
    forming, on the cathode, an electrolysis product comprising one or more of nanowires and nanotubes containing Si, wherein
    the cell voltage applied between the cathode and the anode is less than 3.2V, and
    the cell voltage applied between the cathode and the anode is less than a decomposition potential of the electrolyte, and
    the electrolyte comprises CaO formed by hydrolysis of molten salt $CaCl_2$ during a melting process at a high temperature.

5. The method according to claim 4, wherein the powdered mixture containing the silicon compound $SiO_2$ is a mixture prepared by adding a metal, an alloy, a metal compound $M^1Y$ and/or a nonmetal into the silicon compound $SiO_2$ powder, wherein the metal, the alloy, the metal compound $M^1Y$ and the nonmetal are in powder form.

6. The method of claim 5, wherein the metal is Au, Pt, Ag, Cu, Fe, Co, Ni, Cr, Mo, Zr, Ti, Al, Mg and/or Nb.

7. The method of claim 5, wherein the alloy comprises at least two members selected from the group consisting of Au, Pt, Ag, Cu, Fe, Co, Ni, Cr, Mo, Zr, Ti, Al, Mg and Nb.

8. The method of claim 5, wherein $M^1$ in the metal compound $M^1Y$ is Au, Pt, Ag, Cu, Fe, Co, Ni, Cr, Mo, Zr, Ti, Al, Mg or Nb; Y is O, S, C or N.

9. The method of claim 5, wherein the nonmetal is C, Si, Ge, S, P and/or B.

10. The method of claim 4, wherein the electrolysis product comprises Si nanowires having a diameter of less than 100nm and/or Si nanotubes having a diameter of less than 100nm.

11. The method of claim 1 or claim 4, wherein the metal compound is $MY^1$, M is Ca, Ba, Li, Al, Cs, Na, K or Sr; and $Y^1$ is Cl or F.

12. The method of claim 1 or claim 4, wherein the molten salt in the electrolyte is a mixture of molten salt $CaCl_2$ and one or more other metal compound molten salts.

13. The method of claim 1 or claim 4, wherein the electrolysis is carried out at a temperature from 500° C. to 1000° C.

* * * * *